(12) United States Patent
Boehm

(10) Patent No.: US 9,018,907 B2
(45) Date of Patent: Apr. 28, 2015

(54) METHOD FOR PRECISE POWER PREDICTION FOR BATTERY PACKS

(75) Inventor: Andre Boehm, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 393 days.

(21) Appl. No.: 13/499,145

(22) PCT Filed: Oct. 8, 2010

(86) PCT No.: PCT/EP2010/065138
§ 371 (c)(1),
(2), (4) Date: Jun. 6, 2012

(87) PCT Pub. No.: WO2011/047978
PCT Pub. Date: Apr. 28, 2011

(65) Prior Publication Data
US 2012/0242289 A1    Sep. 27, 2012

(30) Foreign Application Priority Data

Oct. 19, 2009 (DE) .......................... 10 2009 045 783

(51) Int. Cl.
*H02J 7/00* (2006.01)
*B60L 11/18* (2006.01)
*G01R 31/36* (2006.01)

(52) U.S. Cl.
CPC ........... *H02J 7/0047* (2013.01); *B60L 11/1851* (2013.01); *G01R 31/3693* (2013.01); *Y02T 10/7005* (2013.01); *Y02T 10/705* (2013.01)

(58) Field of Classification Search
CPC ............. B60L 11/1851; G01R 31/3693; H02J 7/0047; Y02T 10/7005; Y02T 10/705
USPC .......................... 320/118, 124, 125, 127, 135
See application file for complete search history.

(56) References Cited

U.S. PATENT DOCUMENTS

| | | | |
|---|---|---|---|
| 2005/0110498 A1* | 5/2005 | Plett | 324/433 |
| 2008/0208494 A1 | 8/2008 | Holz et al. | |
| 2009/0017350 A1* | 1/2009 | Umayahara | 429/22 |
| 2009/0284822 A1 | 11/2009 | Du et al. | |

FOREIGN PATENT DOCUMENTS

| | | |
|---|---|---|
| CN | 101147078 | 3/2008 |
| CN | 101506677 | 8/2009 |
| JP | 9-215111 | 8/1997 |
| JP | 10-104325 | 4/1998 |
| JP | 2002-272011 | 9/2002 |
| JP | 2008-104289 | 5/2008 |
| JP | 2008-149903 | 7/2008 |
| JP | 2008-251404 | 10/2008 |
| JP | 2008-283753 | 11/2008 |

OTHER PUBLICATIONS

International Search Report, PCT International Application No. PCT/EP2010/065138, dated Nov. 14, 2011.

* cited by examiner

*Primary Examiner* — Vuthe Siek
(74) *Attorney, Agent, or Firm* — Kenyon & Kenyon LLP

(57) ABSTRACT

A method and apparatus for ascertaining the maximum power obtainable from a traction storage-battery system that includes a plurality of storage-battery elements connected in series. The method provides for: determining at least one power indicator for each storage-battery element, and ascertaining a quantity of the smallest power indicators of all determined power indicators of all storage-battery elements. The quantity includes the smallest power indicator or a subgroup thereof of all power indicators of the storage-battery elements. A power-output limit for the quantity is provided, starting from the power indicators of the quantity. The maximum power obtainable from the traction storage-battery system is extrapolated based on the power-output limit and linked by the extrapolation and because of the series connection, to a power output of the at least one storage-battery element for which the quantity of the smallest power indicators was ascertained.

9 Claims, 1 Drawing Sheet

METHOD FOR PRECISE POWER PREDICTION FOR BATTERY PACKS

FIELD OF THE INVENTION

The present invention relates to an apparatus and a method for determining the operating state of a storage-battery system used for the traction of a vehicle. In particular, the invention relates to a method and an apparatus for ascertaining the maximum power obtainable from a storage-battery system.

BACKGROUND INFORMATION

For hybrid vehicles or electric-powered vehicles, storage-battery elements connected in series are employed, whose total voltage is used for the traction of the vehicle with the aid of an electric motor. Because of, for example, different internal resistances, in such serial storage-battery systems, individual battery elements are loaded more strongly than others, and are therefore subject to a faster aging process. Also, owing to the series connection, the already weakened battery elements are subject to a greater loading due to the series connection.

The overall state is ascertained by measuring the respective cell voltages as well as the total current of the storage-battery system in order, together with the measured temperature of the individual battery elements, to deduce a specific state of the individual battery elements. In particular, the state may be represented by models, the models obtaining measuring data such as temperature, cell voltage and cell current, and based on storage-battery properties which are simulated by the model, the model is able to provide a state of charge, an instantaneous resistance or an instantaneous capacity. To this end, the model may use internal variables, e.g., internal states of the battery elements such as concentrations, internal temperatures or their distributions, or state of charge or usable capacity.

For example, in order to ascertain the still-remaining traveling range of a vehicle which is operated with such a storage-battery system, conventionally, the sum of all states of the individual battery elements is used, in order to be able to deduce the energy still remaining which can be applied in total by the storage-battery system. In so doing, it is customary that the individual state parameters of all elements are combined equally with each other, that is, are averaged or provided by a sum which indicates the traction energy still remaining or other state parameters of the total storage-battery system. From this averaged or summed-up data of all battery elements, for example, a power of the storage-battery system still maximally obtainable is calculated, as well.

For that purpose, first of all, it is necessary that the state parameters of each individual cell be calculated, which means a multitude of instances of the underlying model must be provided and must be supplied with individual measurement data. Secondly, not all states important for the storage-battery system are determined by the averaging; in particular, weak battery elements are treated the same as strong battery elements.

Therefore, conventional methods for determining a maximum obtainable power do not reflect all states of the storage-battery system. Furthermore, conventional methods require a very complicated calculation, which provides an individual state monitoring/state tracking equally for all elements. In addition, already weakened cells continue to be loaded above average.

An object of the present invention is to provide a simplified mechanism for determining the states of a storage-battery system, while at the same time, the states represented more precisely reflect the instantaneous properties of the storage-battery system.

SUMMARY

One question underlying the present invention is whether the overall system with all significant properties is reflected by averaging the individual states. In particular, one question underlying the present invention is whether an above-average high-capacity battery element is able in every case to compensate for a below-average battery element via the averaged status acquisition, in so far as the amounts deviate equally from an average value. In accordance with the present invention, low-capacity storage batteries particularly are taken into account, since they suffer damage by especially great discharging and age considerably. It is not possible to compensate for this effect by another above-average high-performance storage-battery element. According to the present invention, to ascertain the maximum obtainable power (which serves subsequently during operation as the load limit of the overall system), the weakest storage-battery element(s) is/are protected by calculating the maximum obtainable power based on the maximum power of the weakest element. Therefore, the loading of the overall system according to this calculation leads to an individual loading of the weakest element which does not damage the weakest storage-battery element. In contrast, prior methods make use of an average value at which it is ensured that most of the storage-battery elements are not loaded in a damaging manner; however, because of the orientation to the average value, at least the lowest-capacity element is excessively loaded, and thereby ages greatly. This aging impairs the performance of the overall system.

In light of this comparison, it can be seen that the maximum obtainable power can be provided more precisely according to the present invention, since aging processes (which are to be avoided) are taken into account as well, which means the prediction of the performance of the traction storage-battery system is more precise. In particular, it is thereby taken into account that an excessive aging of one individual element affects not only this element, but may possibly impair the entire system; a power rating provided by averaging the states does not take such an impairment into account. The service life of the storage-battery system is increased substantially owing to the method and the apparatus of the present invention, since due to the more precise representation of the maximum obtainable power according to the present invention, the further operation may be a function of this power and therefore avoids stressing the weakest element to the greatest extent possible. Thus, the service life of the storage-battery system is increased when the maximum obtainable power, provided according to the present invention and oriented to the weakest element, is used for the operation of the storage-battery system.

Since, according to the present invention, the weakest storage-battery element(s) generally determine(s) the maximum obtainable power, it is merely necessary to precisely model the states of only this/these element(s). Since because of the series connection, the other storage-battery elements are also tied to the power-output limit of the weakest storage-battery element(s), these storage-battery elements do not have to be monitored via a model; rather, a simple extrapolation of the total power is provided based on the power-output limit for the weakest storage-battery elements. Therefore, only calculations with respect to the weakest storage-battery element are necessary, the extrapolation—without significant deterioration in the precision—based on the state of the weakest storage-battery element, providing the maximum power obtainable from the overall traction storage-battery system.

Therefore, according to the present invention, an example method is provided for ascertaining the maximum power obtainable from a traction storage-battery system that includes a plurality of storage-battery elements connected in series. In particular, the traction storage-battery system may be a system which is used in the drive of an electric-powered vehicle or hybrid vehicle.

The example method allows for providing at least one power indicator for each storage-battery element. The weakest storage-battery element(s) may be determined based on this power indicator. Possibilities as power indicator are, in particular, variables which may be measured directly at the storage-battery element, i.e., current, voltage, temperature or combinations thereof, which indicate the power of the element, for example, the internal resistance as quotient of voltage and current, or other values which relate the current and/or the voltage to the temperature, for instance. For example, a power indicator is yielded from the analysis of a temperature, where, in particular, high temperatures accompanied by otherwise comparable currents or voltages or internal resistances suggest a comparatively small power indicator. The power indicator may represent a variable to be determined directly, a physical variable of the storage-battery element that is yielded from the measured variables, e.g., the internal resistance, or may be a parameter which has no direct correspondence to a physical variable, but combines measured variables and/or variables derived from them, and is significant for the power of the storage-battery element. An example for this is a combination of internal resistance, cell voltage and temperature, e.g., as product or as sum of associated values which are free of physical units, so that a combined power indicator results which rises with decreasing cell voltage, increasing temperature and with rising internal resistance. One or more variables may be deleted from this combination; the variables of the combination may be combined with each other not only by arithmetical operations, but also by general mathematical combinations, e.g., by an extrapolation or a polynomial approximation. Thus, a power indicator of this kind does not directly indicate a flowing electric power, but rather indicates what total capacity, what still-remaining charge or what traction power the storage-battery element in question is still able to contribute to the traction.

From the power indicators which are determined for each storage-battery element, e.g., based on the cell voltage, a quantity of the smallest power indicators of all determined power indicators of all storage-battery elements is ascertained. The quantity may be provided by a single element, that is, by the smallest power indicator of all determined power indicators, or by a subgroup of the smallest power indicators of all power indicators of the storage-battery elements. For instance, the subgroup may be formed by the two smallest or j-smallest power indicators, j being smaller than the number of storage-battery elements, or by all power indicators which are smaller than a predetermined threshold value, e.g., all cell voltages which are less than 2.8 V. Thus, not only the smallest power element, but a group of the smallest power indicators is taken into account. In one especially simplified specific embodiment, only the smallest power indicator is determined, and only the associated (i.e., weakest) storage-battery element is used to calculate the maximum obtainable power, that is, by extrapolation based on the power-output limit of this storage-battery element with the smallest power indicator, to all storage-battery elements of the system.

A power-output limit is provided with respect to this quantity (i.e., one or more smallest power indicators of all power indicators), especially by estimation or approximation with the aid of a model. Such an estimation or approximation with the aid of a model also includes an empirical model, e.g., in the form of a look-up table which, for instance, maps a cell voltage onto a value of a power output. The power-output limit may be provided by an electric power which the associated storage-battery element is still able to furnish at a maximum without suffering damage, by a maximum current which the storage-battery element is still able to provide without damage, and/or by an amount of energy which may still be drawn from the storage-battery element without it being damaged. Thus, according to an example embodiment of the present invention, based on a directly or indirectly determined power-indicator value, a power-output limit is provided for the storage-battery element having the smallest power indicator or for the storage-battery elements of the quantity of smallest power indicators; or power-output limits are provided for each storage-battery element that has a power indicator which belongs to the quantity of smallest power indicators. The power-output limit may be provided solely based on the power indicators themselves, based on further measured physical instantaneous variables of the storage-battery element, or based on derived variables which reflect the present state of the storage-battery element in question. The power-output limit may therefore be based not only on the physical variables on which the power indicators are based, but may also include further variables, in addition to the variables relevant for the power indicators. For instance, a power indicator may be provided solely by one measured cell voltage, the power-output limit being obtained, for example, based on this cell voltage in combination with the measured temperature or in combination with a resistance derived from measured variables or from a model. Further variables on which the power-output limit may be based are state of charge, instantaneous performance capability or other variables, which are ascertained or estimated, e.g., with the aid of a model. Preferably, a model is provided merely for the storage-battery elements which have the smallest power indicator, so that the computational work is simplified considerably.

According to an example embodiment of the present invention, the maximum power obtainable from the overall traction storage-battery system is extrapolated based on this power-output limit. For example, the extrapolation may be a mere multiplication by the number of cells, or a mapping of the power-output limit or limits, which stand for a group of weak storage-battery elements, onto the total series connection of the storage-battery system. Because of the extrapolation, and particularly due to the series connection, the maximum power obtainable from the overall system may be calculated based on the power-output limit which holds true only for one or for a few storage-battery elements. Since, because of the series connection, the current is defined by the weakest element (i.e., by the smallest maximally permissible current), the extrapolation may be provided by a simple mean. According to further specific embodiments, in the extrapolation, for example, the internal resistance of a plurality or of all storage-battery elements is taken into account, or the cell voltage, in order in the case of a prognosticated load, to be able to infer the exact cell voltage of the storage-battery element having the smallest power indicator; in addition, elements or cells having a low internal resistance and a high cell voltage may have a negative impact on the cell voltage of the storage-battery element having the smallest power indicator and may additionally reduce this cell voltage.

Therefore, according to the present invention, extrapolation is considered as orientation based on the smallest power indicator or based on the power-output limit of the storage-battery element having the smallest power indicator, in order to infer from it, the maximum obtainable power. Since the storage-battery elements which do not have the smallest power indicator/s are able to be loaded more strongly without suffering damage, it may be expected of them that no maximum obtainable power which may be harmful for them is generated owing to the extrapolation. Due to the orientation to the power output, which is linked to the smallest power indicator, it is equally ensured that even the weakest element in the series connection, i.e., the storage-battery element (or the storage-battery elements) having the smallest power indicator (i.e., having the smallest power indicators) suffers no damage. The power-output limit reflects the power of the weakest storage-battery element, at which the weakest storage-battery element suffers essentially no damage, and if this power is exceeded, a substantial damage occurs. Since this transition is continuous, a threshold value as of which, for example, an above-average aging or discharging beyond a predefined limit occurs, is accepted as substantially harmful. To ensure a safety factor in the extrapolation, preferably the power-output limit itself is not taken as orientation for the extrapolation, but rather the power-output limit minus a predefined amount which represents a safety margin. For instance, the amount may be predefined by a predefined fraction of the power-output limit, e.g., 10%, or by a voltage value, power value or energy value. The maximum obtainable power thus extrapolated is output in the form of a value.

The correlation between power indicator and power-output limit, i.e., the extrapolation, may be provided by increasing a load of the traction storage-battery system step-by-step or continuously, until one storage-battery element has a power indicator that lies below a limit. In this specific embodiment, the extrapolation is not provided as calculation, but rather, a load of the overall traction storage-battery maps the effects of a called-for power onto the power indicator or onto the power-output limit. In this context, only the smallest power indicator of all power indicators is relevant. In this specific embodiment, the cell voltage is utilized as power indicator, the power-output limit being the power which the storage-battery element having the smallest power indicator outputs (cell voltage corresponds to a bottom limiting value). In this case, the power-output limit is oriented to a cell voltage as power indicator, the least cell voltage, i.e., the weakest storage-battery element, providing the power-output limit as the power which is output by this element when the smallest power indicator reaches a limit.

Therefore, the power-output limit is provided by operating the storage-battery system along the power-output limit of one storage battery, including: Loading the entire storage-battery system, the storage-battery element being operated along the power-output limit, or operating only the storage-battery element with a power which corresponds to the power-output limit. The operation of the storage battery along the power-output limit includes changing, especially increasing, the power called for, e.g., by increasing a discharging current, until the smallest power indicator has reached a threshold value. This threshold value corresponds to the power-output limit which, if exceeded, brings with it damage to the weakest storage-battery element. The load may be increased stepwise, especially by an iterative increase, where the increment is a function of a separation between the measured power indicator and the threshold value, or equally, is a function of the power actually output by the storage-battery element having the smallest power indicator and the power-output limit.

In particular, the example method provides for loading the storage-battery system overall with a constantly drawn power, in order to ascertain the resulting voltage characteristic of all cells as a function of time. The maximum obtainable power is yielded from the product of the current characteristic or the absolute current value at which the power-output limit of the storage-battery element having the smallest power indicator was encountered, and the sum of the voltage characteristics or the associated voltages of all storage-battery elements which were provided at this current by the storage-battery elements. During operation of the storage-battery system, it is preferably operated only below the power-output limit, and the load is reduced when the power-output limit of the storage-battery element having the smallest power indicator reaches the power-output limit, minus the predefined amount.

Preferably, the ascertainment of the quantity of the smallest power indicators includes only the ascertainment of the smallest power indicator, the quantity being provided by this smallest power indicator. Accordingly, the power-output limit is provided, starting from this smallest power indicator. The maximum obtainable power is realized based on the power output of the storage-battery element having the smallest power indicator, so that only the values of one cell (i.e., the weakest cell) are used for the extrapolation.

The power indicator may be determined by measuring a cell voltage which is available at the storage-battery elements and determining a load current with which the traction storage-battery system is loaded, e.g., during operation of the storage-battery system along the power-output limit. The determination may further be provided by measuring a temperature which the storage-battery elements exhibit or which the storage-battery element having the smallest power indicator exhibits. The power indicator may further be determined based on an internal resistance, a state of charge, a cell capacity or other status parameters of the storage-battery elements. In particular, a combination of these variables may be used as power indicator. Therefore, the determination of the power indicator includes the measurement of at least one operating variable of the storage-battery elements, preferably during operation of the storage-battery system along the power-output limit. By preference, current, voltage or temperature are measured as operating variables. The determination may also include ascertainment of the power indicator by a model which simulates the storage-battery element. During the determination of the power indicator, a measurement may also be combined with an ascertained variable.

Preferably, the determination of the power indicator includes a repeated determination of the power indicator, or of measured variables on which it is based, at different load currents with which the traction storage-battery system is loaded, especially during operation of the storage-battery system along (however preferably below) the power-output limit. The load currents are preferably provided in rising sequence, starting from a load current at which it may be assumed that it will not result in the exceeding of a power-output limit of a storage-battery element. The load current may be increased repeatedly, preferably step-by-step, the increment either being constant or, in particular, iterative as a function of the separation between the actual power of the storage-battery element having the smallest power indicator, and the associated power-output limit.

According to a further variant of the present invention, the power-output limit is provided by comparing the power indicator to a predefined minimum power-indicator value or by forming the difference between the determined power indicator and the minimum power-indicator value. Furthermore, the cell voltage or cell voltages may be compared as power indicator to the quantity, especially to a minimum cell voltage as predefined minimum power indicator. The minimum cell voltage is a function of the type of the storage-battery elements. The minimum cell voltage is less by a predefined voltage amount than a standard output voltage (which, for example, exists in the case of a 100% charged element). The standard output voltage, particularly the predefined voltage amount, i.e., their difference, are defined because irreversible damage to the storage-battery elements occurs when they are discharged to the standard output voltage, minus the voltage amount. In the case of lithium-ion storage batteries, the standard output voltage minus the voltage amount is 2.8 V, for example, so that the minimum power-indicator value corresponds to this cell voltage.

According to a further specific embodiment, the maximum obtainable power is extrapolated on the basis of the power output of the weakest storage-battery element(s) for which the quantity of the smallest power indicators was determined. The maximum power obtainable from the total traction storage-battery system is extrapolated under the stipulation that the power output of the weakest storage-battery element(s) within an overall assembly is not greater than the power-output limit, minus the predefined amount. The traction storage-battery system which includes all storage-battery elements is regarded as the overall assembly. This stipulation with respect to the extrapolation takes into account that the weakest member, i.e., the storage-battery element having the smallest power indicator (having the least cell voltage) is not overloaded, so that the weakest storage-battery element determines the power able to be output altogether. The relationship between the power able to be output by the weakest storage-battery element, and the maximum obtainable power of the other storage-battery elements results owing to the series connection, in which the weakest member determines the maximum load, i.e., the power to be output at the maximum or the discharging current to be output at the maximum. In this context, the power-output limit itself is not intended as the goal, but rather the power-output limit minus a predefined amount which is greater than zero and corresponds at the maximum to a safety-factor power amount which reflects a safety margin sufficient for all cases, but possibly reduces the maximum obtainable power beyond what is necessary.

The maximum obtainable power is evaluated as current, or is provided as product of the current value and a total voltage of the traction storage-battery system. The power output of the weakest storage-battery element(s) is provided by the cell voltage of the weakest storage-battery element (or the cell-voltage sum of the weakest storage-battery elements). The power-output limit is provided by a predefined minimum voltage amount, which is oriented to the cell voltage. The minimum voltage amount corresponds to the voltage which, if undershot, leads to irreversible damage, no storage-battery element of the storage-battery system dropping below the minimum voltage amount. The safety-factor power amount may also be defined by an estimated measuring-error scattering in the cell-voltage measurement, so that even if the cell-voltage measurements are imprecise, the safety-factor power amount, that is, the additional voltage amount, still sufficiently protects the storage-battery element having the lowest cell voltage from irreversible damage.

The present invention further includes an example apparatus for the ascertainment process, having a voltage-measuring device, a current-measuring device and a power-data acquisition device that is connected to these measuring devices. The voltage-measuring device is connected to each storage-battery element in order to pick off its cell voltage, and the current-measuring device is provided to measure the current provided by the storage-battery system, i.e., the discharging current (or perhaps the charging current). The power-data acquisition device determines a power indicator based on the cell voltage or perhaps based on the resulting internal resistances (by quotient of the cell voltage and measured current) for all storage-battery elements. At least, however, the power-data acquisition device provides the power indicator for the storage-battery element having the smallest power indicator, i.e., having the least cell voltage (or perhaps having the highest temperature). A comparator is connected to the power-data acquisition device, and compares the power indicators in order to ascertain from them, the smallest power indicator or a quantity of the smallest power indicators.

The example apparatus further includes an extrapolation device which is connected to the comparator and which extrapolates the power-output limit of the weakest storage-battery element based on the associated (i.e., smallest) power indicator, for example, by a mapping based on approximation of a model or based on empirical data. In particular, this may be provided by a simple multiplication of the least cell voltage by the measured current. During the extrapolation, it is taken into account that, because of the series connection of the storage batteries, the maximum obtainable power is linked to the power output of the weakest storage-battery element, the extrapolation device performing the extrapolation according to a stipulation which provides that the maximum obtainable power of the weakest storage-battery element lies by a predefined amount, (i.e., by a safety margin) below the power-output limit.

The example apparatus may further include a temperature-measuring device which measures the temperatures of all storage-battery elements. The extrapolation device may provide a model which, based on the measured current, the measured voltage, and based on the temperature thus measured, estimates an operating state of the weakest storage-battery element. The operating state may be reflected by a capacity, a state of charge, an internal resistance or a combination thereof, which the weakest storage-battery element exhibits.

Preferably, the comparator is set up merely to determine the smallest power indicator (and not a plurality of smallest power indicators). According to this simple specific embodiment, the extrapolation device is set up merely to extrapolate the power output of the weakest storage-battery element. For further simplification, the extrapolation device basically includes a multiplication device which multiplies the power-output limit of the weakest storage-battery element by the number of storage-battery elements in the system, and outputs the product as the maximum obtainable power.

DETAILED DESCRIPTION OF EXAMPLE EMBODIMENTS

Figure 1:
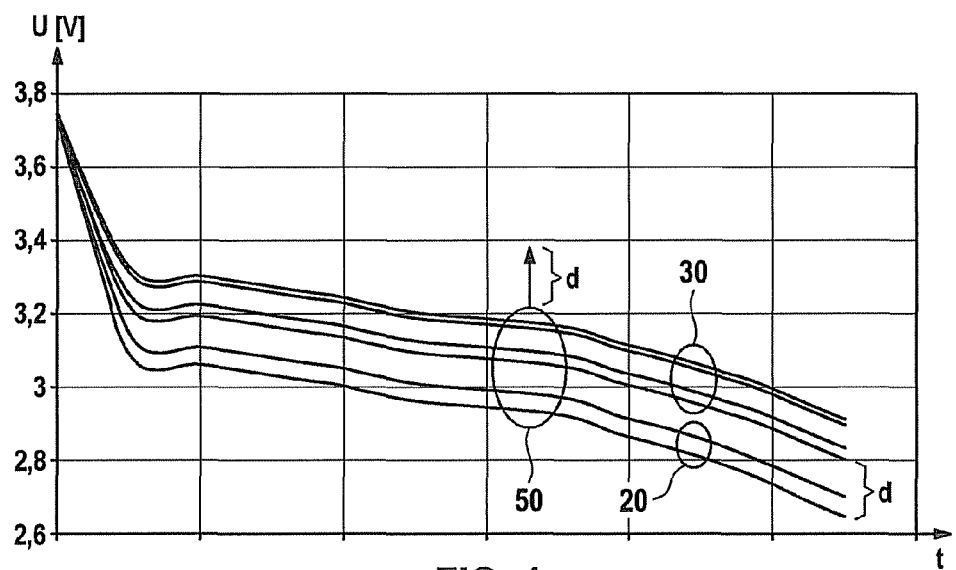
FIG. 1 shows a conventional cell-voltage characteristic, as well as the effects of the example method according to the present invention.
Figure 2:
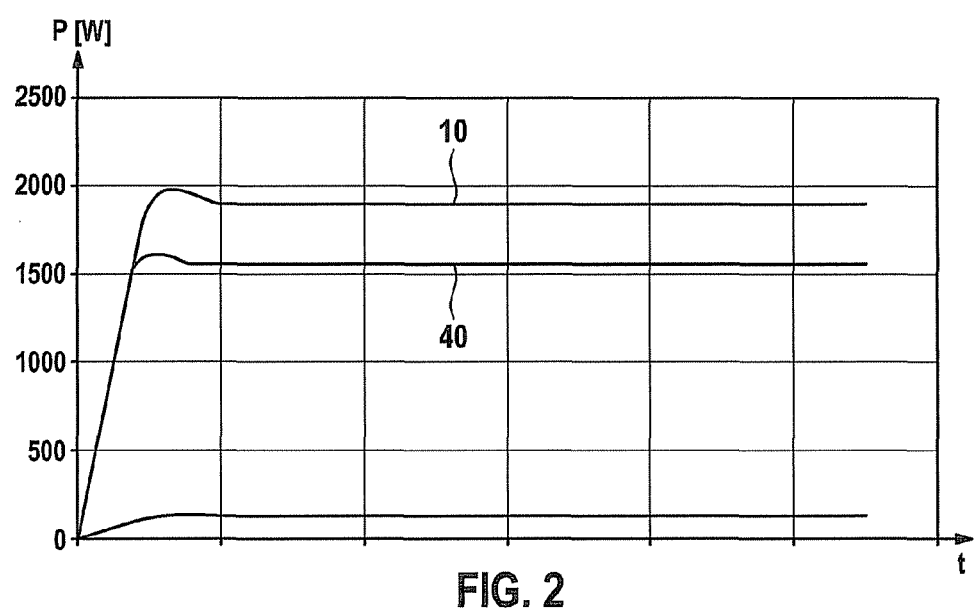
FIG. 2 shows a conventional load characteristic according to the related art, as well as a load characteristic according to the example method of the present invention.

FIG. 1 shows five different cell voltages over time in the case of a load as provided in FIG. 2. At first, the voltage characteristic corresponds to the load according to curve 10 in FIG. 2. Due to the high power, the two weakest storage-battery elements fall in their cell voltage 20 below a value of 2.8 V, below which permanent damage to the cells or increased aging may be assumed. In spite of the high load according to curve 10 in FIG. 2, the other cells which, because of their higher power, have a characteristic 30 that lies above characteristic 20 of the weaker cells, are not loaded to such an extent that damage remains, especially since their voltages remain above 2.8 V. Since conventionally, the average of all cell voltages is used as power indicator, on average, also no cell voltage results which lies below a critical value of 2.8 V, so that a maximum obtainable power is permissible. However, a drop by characteristics 20 below the limit voltage of 2.8 V leads to an immediate cutoff and bypass of the corresponding cells, resulting in a considerable loss in driving comfort.

The example method of the present invention does not use the misdirecting average value of the cell voltages here, but rather the minimum cell voltages, which are represented by voltage characteristics 20. Since it is not the average value, but rather the smallest power indicators (here: the cell voltage) which are used to ascertain the maximum obtainable power, they are taken into account in such a way that the maximum power obtainable from the total storage-battery system is provided so as to be reduced to the extent that the smallest power indicators do not drop below the critical value of 2.8 V. A characteristic of the maximum obtainable power provided according to the present invention is yielded by characteristic 40 of FIG. 2, which in particular, lies below characteristic 10, and is such that none of the cell voltages falls below a critical value of 2.8 V. In particular, due to the loads of FIG. 2, the cell-voltage characteristic is changed (decreased) in such a way that it is shifted upward by a distance d, so that even the weakest storage-battery element has no cell voltage below the critical voltage of 2.8 V. Overall, therefore, all characteristics 50 of FIG. 1 are shifted upward owing to maximum obtainable power 40 provided according to the present invention, so that the weakest element, i.e., its power-output limit, which results at 2.8 V of the cell voltage, is taken into account and is not undershot.

FIG. 2 shows a test characteristic of output powers with which the effect of the example method according to the present invention may be illustrated, in combination with the associated cell-voltage characteristics in FIG. 1. Characteristic 40, especially the value during the constant profile (in the steady state) is the result of the maximum obtainable power, ascertained according to the present invention, which is provided by the constant value of characteristic 40 after the transient phase.

The example method leading to a characteristic according to FIG. 1, raised by d, includes first of all, ascertaining which of the storage-battery elements has the smallest power indicator. The smallest power indicator is determined by comparing the cell voltages, the power indicators being proportional or identical to the voltage values. This storage-battery element is tested with respect to the power-output limit, in doing which, the output power or a discharging current is increased until the power-output limit is reached in the form of reaching a critical cell voltage of 2.8 V. From the associated current and the thus (barely) reached limit voltage, the maximum possible power output of the weakest storage-battery element may be calculated by multiplication. Based on this power output of the single smallest storage-battery element, the total power of the overall system is extrapolated, with the stipulation that all storage-battery elements are operated with an output power or with an output current which corresponds to the maximum possible power output of the weakest storage-battery element.

A driving control may then provide that a limit go into effect when a power greater than the maximum obtainable power is called for, in order to thus protect the weakest element or the weaker elements from too high a power output.

What is claimed is:

1. A computer-implemented method for ascertaining a maximum obtainable power from a traction storage-battery system that includes a plurality of storage-battery elements connected in series, comprising:
   determining, using at least one computer processor, at least one power indicator for each of the storage-battery elements;
   ascertaining, by the at least one computer processor, a quantity of a smallest power indicators of all determined power indicators of all storage-battery elements, the quantity including one of a smallest power indicator or a subgroup of the smallest power indicators of all power indicators of the storage-battery elements;
   providing a power-output limit for the quantity by operating the storage-battery system along the power-output limit of one of the storage-battery elements, by one of estimation or by approximation with the aid of a model that reflects the storage-battery elements, starting from the power indicators of at least one of the quantity and other measured physical instantaneous variables of the one of the storage-battery elements;
   extrapolating the maximum power obtainable from the traction storage-battery system based on the power-output limit, the maximum power obtainable from the traction storage-battery system being linked by the extrapolation to a power output of the at least one storage-battery element for which the quantity of the smallest power indicators was ascertained, which lies by a predefined amount below the power-output limit; and
   outputting the maximum power obtainable from the traction storage-battery system as a value,
   wherein the extrapolation includes extrapolating the maximum obtainable power based on power output of at least one of weakest of the storage-battery elements for which the quantity of the smallest power indicators was ascertained, the extrapolation process extrapolating the maximum power obtainable from the total traction storage-battery system under a stipulation that the power output of the at least one of the weakest storage-battery elements within an overall assembly provided as the traction storage-battery system that includes all storage-battery elements, is not greater than the power-output limit minus a predefined amount, the predefined amount being greater than zero and corresponding at a maximum to a safety-factor power amount.

2. The method as recited in claim 1, wherein the ascertainment of the quantity includes ascertaining the smallest power indicator, the quantity being provided by the smallest power indicator, where the step of providing the power-output limit includes starting from the smallest power indicator, and the extrapolation is carried out based on power output of the storage-battery element having the smallest power indicator.

3. The method as recited in claim 1, wherein the determination of the power indicator includes measuring, as the power indication, at least one of a cell voltage which is available at the storage-battery elements, a load current with which the traction storage-battery system is loaded, a temperature which the storage-battery elements exhibit, an internal resistance of the storage-battery elements, a state of charge, and a cell capacity, and the determination of the power indicator further includes at least one of measuring at least one operating variable of the storage-battery elements, the operating variable being one of current, voltage or temperature, and ascertaining the power indicator by a model that simulates the storage-battery element.

4. The method as recited in claim 1, wherein the determination of the power indicator further includes repeated determination of the power indicator one of at different load currents with which the traction storage-battery system is loaded, or by repeated step-by-step increase of the load current and determining the power indicator for each stepwise increased load current.

5. The method as recited in claim 1, wherein the power-output limit is provided one of by comparing the power indicator to a predefined minimum power-indicator value, by forming the difference between the determined power indicator and the minimum power-indicator value, or by comparing cell voltage as power indicator of the quantity, to a minimum cell voltage as predefined minimum power indicator, the minimum cell voltage being a function of a type of the storage-battery elements and being less by a predefined voltage amount than a standard output voltage, and irreversible damage to the storage-battery elements occurring when the storage-battery elements are discharged to the standard output voltage minus the predefined voltage amount.

6. The method as recited in claim 1, wherein the maximum power obtainable from the traction storage-battery system is provided as one of a current value, or product of the current value and a total voltage of the traction storage-battery system;
the power output of the at least one of the weakest of the storage-battery elements is provided by the cell voltage of a weakest one of the storage-battery elements or by the cell-voltage sum of a plurality of the at least one weakest storage-battery elements;
the power-output limit is provided by a predefined minimum voltage amount which, in order to avoid irreversible damage, should not be undershot by any storage-battery element; and
the safety-factor power amount is provided by an additional voltage amount that corresponds to a safety margin which is defined by an estimated measuring-error scattering in cell-voltage measurement.

7. An apparatus for ascertaining a maximum power obtainable from a traction storage-battery system that includes a plurality of storage-battery elements connected in series, the apparatus comprising:
a voltage-measuring device, connected to each of the storage-battery elements, configured to measure voltage available at the storage-battery elements;
a current-measuring device, connected to the traction storage-battery system, configured to measure a current output by the traction storage-battery system;
a power-data acquisition device, connected to the voltage-measuring device and the current-measuring device, configured to one of provide a power indicator for all storage-battery elements based on voltage available at the respective storage-battery elements, provide a power indicator for all storage-battery elements based on internal resistances of the storage-battery elements resulting from the voltage available and output current, or provide a power indicator for one of the storage-battery elements having the smallest power indicator;
a comparator, connected to the power-data acquisition device, configured to compare the power indicators, and to ascertain at least one of the smallest power indicators; and
an extrapolation device which is connected to the comparator and which is set up to extrapolate the power-output limit of at least one of the storage-battery elements having the smallest power indicator based on the at least one of the smallest power indicators, and to extrapolate, based on the power-output limit, the maximum power obtainable from the traction storage-battery system, so that the maximum power obtainable from the traction storage-battery system is linked to a power output of the at least one storage-battery element which has the smallest power indicators, that lies by a predefined amount below the power-output limit,
wherein the extrapolation device is configured to extrapolate the maximum power obtainable based on power output of at least one of weakest of the storage-battery elements for which the quantity of the smallest power indicators was ascertained, the extrapolation device configured to extrapolate the maximum power obtainable from the total traction storage-battery system under a stipulation that the power output of the at least one of the weakest storage-battery elements within an overall assembly provided as the traction storage-battery system that includes all storage-battery elements, is not greater than the power-output limit minus a predefined amount, the predefined amount being greater than zero and corresponding at a maximum to a safety-factor power amount.

8. The apparatus as recited in claim 7, further comprising:
a temperature-measuring device, connected to the extrapolation device, configured to measure a temperature of the storage-battery elements, the extrapolation device including a model which, based on measured current, measured voltage and the measured temperature, estimates an operating state of the at least one of the storage-battery elements having the smallest power indicator, the operating state being reflected by at least one of a capacity, a state of charge, and an internal resistance, of the at least one of the storage-battery elements having the smallest power indicator.

9. The apparatus as recited in claim 7, wherein the comparator is configured to determine a smallest power indicator and the extrapolation device is configured to extrapolate the power-output limit of the one of the storage-battery elements having the smallest power indicator, and the extrapolation device further includes a multiplication device, the extrapolation device being configured to calculate, based on the power-output limit of the storage-battery element having the smallest power indicator and with the aid of the multiplication device, the maximum power obtainable as a product of the power-output limit and a number of storage-battery elements in the storage-battery system.

* * * * *